United States Patent
Jang et al.

(10) Patent No.: US 7,324,399 B2
(45) Date of Patent: Jan. 29, 2008

(54) REFRESH CONTROL CIRCUIT AND METHOD FOR PERFORMING A REPETITION REFRESH OPERATION AND SEMICONDUCTOR MEMORY DEVICE HAVING THE SAME

(75) Inventors: Young Min Jang, Seoul (KR); Jin Ho So, Sungnam-si (KR); Hyung Dong Kim, Suwon-si (KR)

(73) Assignee: Samsung Electronics Co., Ltd, Gyeonggi-do (KR)

( * ) Notice: Subject to any disclaimer, the term of this patent is extended or adjusted under 35 U.S.C. 154(b) by 82 days.

(21) Appl. No.: 11/270,650

(22) Filed: Nov. 10, 2005

(65) Prior Publication Data
US 2007/0019491 A1 Jan. 25, 2007

(30) Foreign Application Priority Data
Jul. 19, 2005 (KR) ...................... 10-2005-0065113

(51) Int. Cl.
*G11C 7/00* (2006.01)
(52) U.S. Cl. ............. 365/222; 365/230.06; 365/230.03
(58) Field of Classification Search ................ 365/222, 365/230.06, 230.03
See application file for complete search history.

(56) References Cited

U.S. PATENT DOCUMENTS 6,122,214 A * 9/2000 Fujimoto et al. ........... 365/222

2004/0130958 A1 7/2004 Takahashi et al.

FOREIGN PATENT DOCUMENTS

| JP | 4034794 | 2/1992 |
| JP | 5-266658 | 10/1993 |
| KR | 10-2000-0052491 | 8/2000 |
| WO | 02082454 | 10/2002 |

OTHER PUBLICATIONS

Korean Office Action (with English translation) dated Jun. 27, 2006.

* cited by examiner

*Primary Examiner*—Huan Hoang
(74) *Attorney, Agent, or Firm*—Harness, Dickey & Pierce, PLC (57) ABSTRACT

A refresh control circuit and semiconductor devices that may include an address counter for generating a counting address, a repetition address selector for generating a repetition address, a repetition refresh controller for generating a refresh repetition signal based on the counting address and repetition address, and a row decoder for selecting a row of a memory bank based on the counting address and the refresh repetition signal. A method for performing a refresh operation on a semiconductor device that may include receiving a refresh trigger, generating a counting address, generating a repetition address corresponding to a row having a degraded memory cell, providing a refresh repetition signal based on a comparison of the counting address and repetition address, and selecting a row to be refreshed based on one or more of the counting address, repetition address, and the refresh repetition address.

23 Claims, 12 Drawing Sheets

REFRESH CONTROL CIRCUIT AND METHOD FOR PERFORMING A REPETITION REFRESH OPERATION AND SEMICONDUCTOR MEMORY DEVICE HAVING THE SAME

PRIORITY STATEMENT

This application claims the benefit of Korean Patent Application No. 10-2005-65113, filed on Jul. 19, 2005, the entire contents of which are incorporated herein by reference.

BACKGROUND OF THE INVENTION

1. Field of the Invention

Example embodiments of the present invention relate to a refresh control circuit for performing a refresh operation to preserve data stored in memory cells and a semiconductor memory device having the same.

2. Description of the Related Art

In a semiconductor memory device such as Dynamic Random Access Memory (DRAM), a refresh operation of detecting and amplifying data stored in memory cells and rewriting the data in the memory cells may be performed at regular intervals. Through such a refresh operation, data stored in memory cells can be preserved. Semiconductor memory devices requiring such refresh operations as described above generally include refresh control circuits.

In a semiconductor memory device, a specific memory cell may have degraded refresh characteristics relative to other memory cells due to imbalance in a manufacturing process or the imbalance and/or insufficiency of material. Such a degraded memory cell requires a shorter refresh interval than normal memory cells.

Figure 1:
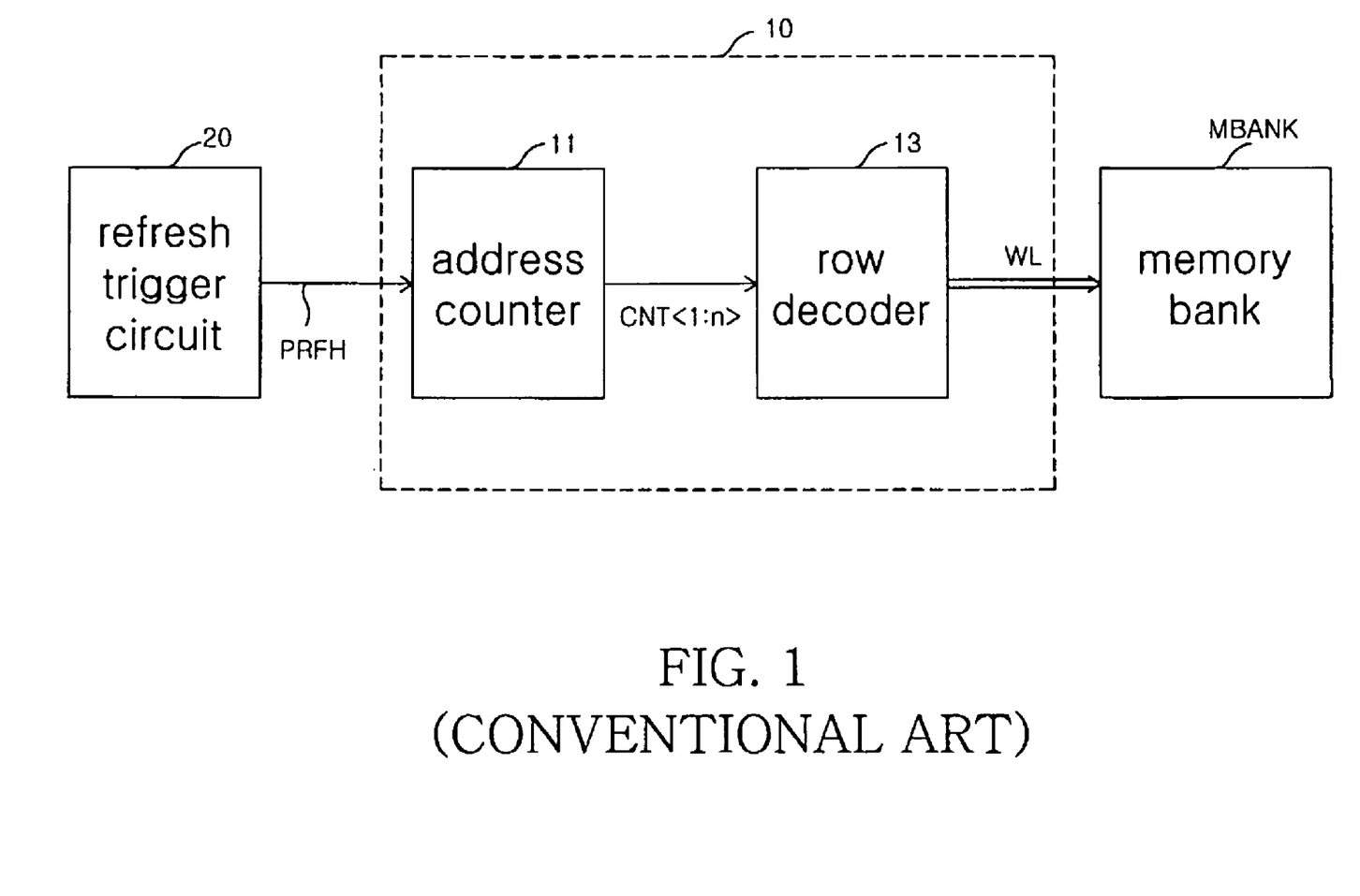
FIG. 1 is a diagram illustrating a conventional refresh control circuit and a semiconductor memory device having the same.

FIG. 1 is a diagram illustrating a conventional refresh control circuit 10 and a semiconductor memory device having the same. The refresh control circuit 10 may operate to sequentially select the rows of a memory bank MBANK and activate word lines WL corresponding to selected rows, in response to the activation of a refresh trigger signal PRFH. Conventionally, the refresh trigger signal PRFH is a signal activated at intervals and is provided by a refresh trigger circuit 20. An address counter 11 may generate sequentially variable counting address CNT<1:n> in response to the activation of the refresh trigger signal PRFH. Furthermore, a row decoder 13 may decode the counting address CNT<1:n>, select a row of a memory bank MBANK, and activate the word line of the selected row.

Figure 2:
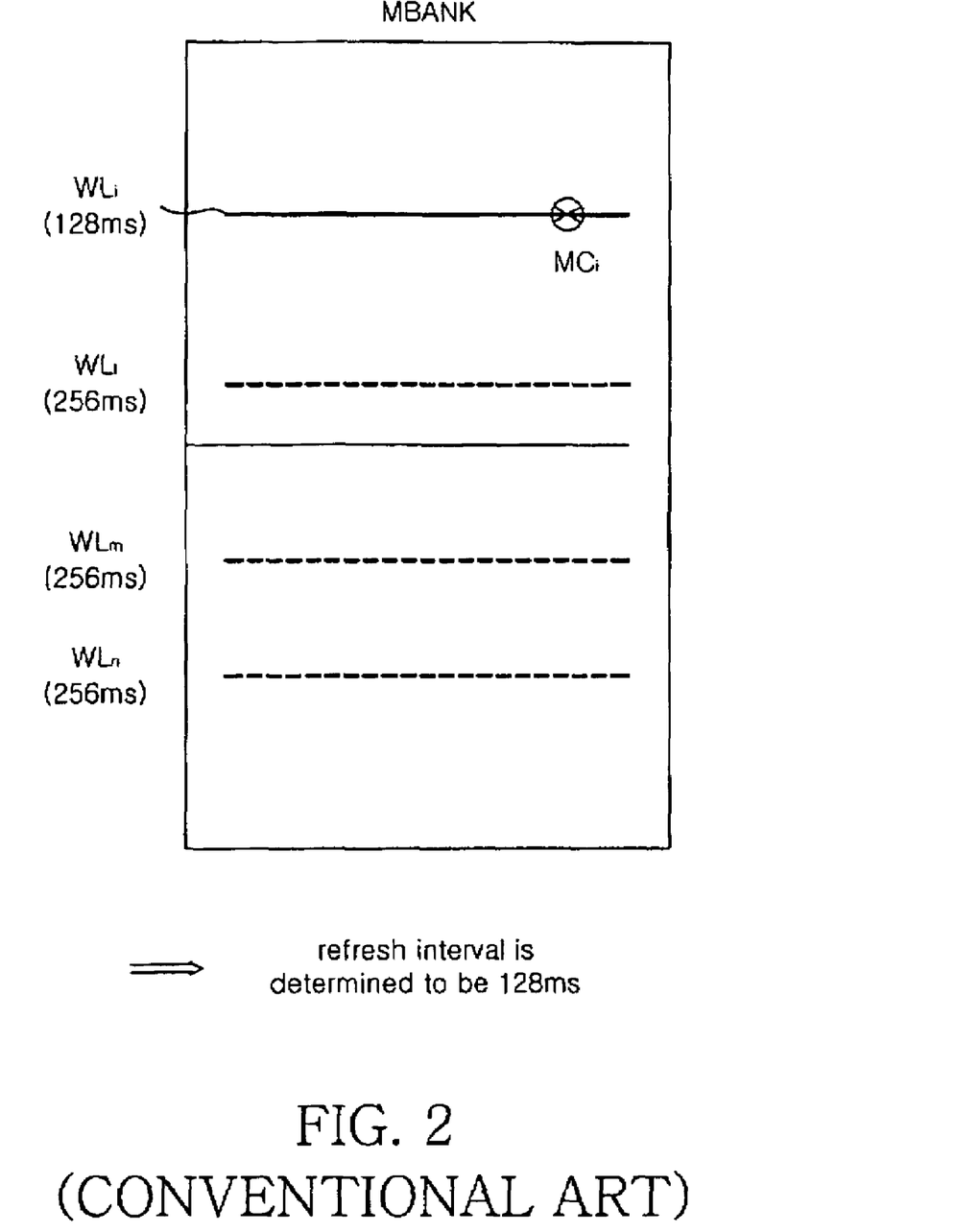
FIG. 2 is a diagram illustrating a method of determining a refresh interval in the conventional semiconductor memory device.

In accordance with the conventional refresh control circuit 10 shown in FIG. 1, all the memory cells included in a single memory bank MBANK are refreshed at the same refresh interval. For example, as shown in FIG. 2, assume that at least one degraded memory cell MCi is present in a memory bank MBANK. According to this conventional example, a refresh interval for the memory bank MBANK is determined based on the degraded memory cell MCi. Assuming the refresh interval required for the degraded memory cell MCi is 128 ms and the refresh interval required for the other memory cells is 256 ms, the refresh interval for the conventional semiconductor memory device is set to 128 ms. That is, for the memory cells other than the degraded memory cell MCi, the refresh interval is set to 128 ms on the basis of the degraded memory cell MCi even though the refresh interval could be set to 256 ms.

Accordingly, in a semiconductor memory device having a conventional refresh control circuit 10, the refresh interval is inefficiently set, so that excessive power is consumed due to the repetition of an unnecessary operation, thereby incurring the degradation of characteristics of a DRAM.

SUMMARY OF THE INVENTION

An example embodiment of the present invention provides a refresh control circuit for a semiconductor device. The refresh control circuit may include an address counter configured to generate a counting address composed of a plurality of bits; a repetition address selector configured to generate a repetition address; a repetition refresh controller configured to generate a refresh repetition signal based on the counting address and the repetition address; and a row decoder configured to select one or more rows of at least one memory bank based on the counting address and the refresh repetition signal. A row decoder according to an example embodiment of the present invention may select a row of a memory bank regardless of at least one bit of the counting address. A row decoder according to an example embodiment of the present invention may select a row based on a first portion of the counting address and ignore a second portion of the counting address.

An example embodiment of the present invention provides a semiconductor memory device. The semiconductor memory device may include a memory bank having a plurality of memory cells arranged in a matrix composed of rows and columns; a refresh trigger circuit configured to generate a refresh trigger signal that is activated at refresh intervals; and a refresh control circuit configured to sequentially select one or more rows of a memory bank in response to the refresh trigger signal and select one or more rows corresponding to a repetition address at least two times during a single refresh cycle interval.

An example embodiment of the present invention provides a semiconductor memory device. The semiconductor memory device may include a plurality of memory banks each having a plurality of memory cells arranged in a matrix composed of rows and columns; a refresh trigger circuit configured to generate a refresh trigger signal that is activated at refresh intervals; a plurality of refresh control circuits each configured to enable in response to a corresponding repetition enable signal and control refresh of a corresponding memory bank, the refresh control circuit sequentially selecting rows of the memory bank in response to the refresh trigger signal and operating to select a row corresponding to a repetition address at least two times during a single refresh cycle interval; and a bank selector configured to generate a bank selection address specifying the memory bank. The repetition enable signal may be enabled in response to the bank selection address.

An example embodiment of the present invention provides a method of performing a repetition refresh operation on a semiconductor device including at least one memory bank having at least two memory blocks. The method may include receiving a refresh trigger signal having a first portion and second portion, the second portion having at least one bit corresponding to any one of the at least two memory blocks; generating a counting address having a first portion and second portion in response to the refresh trigger signal, the second portion having at least one bit corresponding to any one of the at least two memory blocks; generating a repetition address corresponding to a row having at least one degraded memory cell; providing a refresh repetition signal based on a comparison of the counting address and repetition address; and selecting a row to be refreshed based on at least one of the counting address, repetition address, and the refresh repetition signal.

An example embodiment of the present invention provides a row decoder. The row decoder may include a pre-decoding unit configured to receive a counting address having a plurality of bits and pre-decode the counting address into a first pre-decoding address and a second pre-decoding address corresponding to any one of the memory blocks included in at least one memory bank; a block decoding unit configured to decode the second pre-decoding address and selectively activate at least one pair of block decoding addresses based on a refresh repetition signal; and a word line decoding unit configured to drive at least one word line based on the at least one pair of block decoding address and the first pre-decoding address.

BRIEF DESCRIPTION OF THE DRAWINGS

Example embodiments of the present invention will be more clearly understood from the following detailed description of example embodiments of the present invention taken in conjunction with the accompanying drawings, in which.

DESCRIPTION OF EXAMPLE EMBODIMENTS OF THE PRESENT INVENTION

Example embodiments of the present invention will now be described more fully with reference to the accompanying drawings. Example embodiments of the present invention are described with emphasis on circuits related to a refresh operation, and thus descriptions of other circuits extraneous to the teachings of the present invention are omitted from the specification. Reference numerals are used throughout different drawings to designate the same or similar components.

Detailed illustrative embodiments of the present invention are disclosed herein. However, specific structural and functional details disclosed herein are merely representative for purposes of describing example embodiments of the present invention. This invention may, however, may be embodied in many alternate forms and should not be construed as limited to only the example embodiments set forth herein.

Accordingly, while example embodiments of the invention are capable of various modifications and alternative forms, embodiments thereof are shown by way of example in the drawings and will herein be described in detail. It should be understood, however, that there is no intent to limit example embodiments of the invention to the particular forms disclosed, but on the contrary, example embodiments of the invention are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments of the present invention. As used herein, the term "and/or" includes any and all combinations of one or more of the associated listed items.

The terminology used herein is for the purpose of describing particular embodiments only and is not intended to be limiting of example embodiments of the invention. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the FIGS. For example, two FIGS. shown in succession may in fact be executed substantially concurrently or may sometimes be executed in the reverse order, depending upon the functionality/acts involved.

Figure 3:
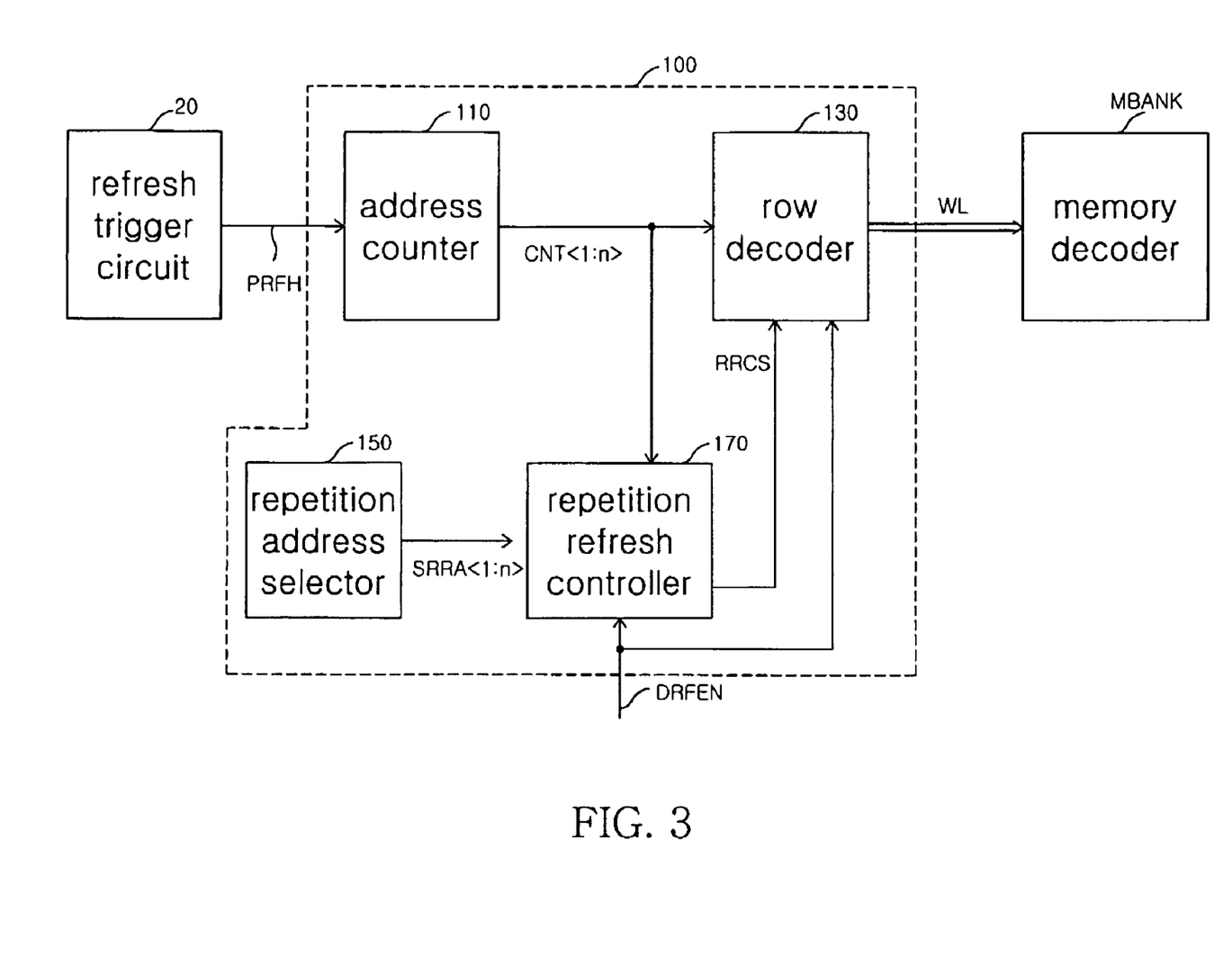
FIG. 3 is a diagram schematically illustrating a refresh control circuit according to an example embodiment of the present invention and a semiconductor memory device having the same.

FIG. 3 is a diagram schematically illustrating a refresh control circuit according to an example embodiment of the present invention and a semiconductor memory device having the same. Although a single memory bank MBANK is shown in FIG. 3, the number of memory banks MBANK may be two or more.

Referring to FIG. 3, a semiconductor memory device according to an example embodiment of the present invention may include a memory bank MBANK, a refresh trigger circuit 20 and a refresh control circuit 100. The memory bank MBANK may include a plurality of memory cells (not shown) arranged in a matrix composed of rows and columns. Furthermore, the memory cells may be divided into at least two memory blocks that use separate bit lines.

According to an example embodiment of the present invention, a refresh trigger circuit 20 may generate a refresh trigger signal PRFH. The refresh trigger signal PRFH may be activated at refresh intervals. The refresh control circuit 100 may select one or more rows of the memory bank MBANK in response to the refresh trigger signal PRFH. Further, according to an example embodiment of the present invention, an operation may be performed such that a word line of a row corresponding to a repetition address SRRA<1:n> may be selected at least two times in a single refresh cycle interval.

According to an example embodiment of the present invention, a refresh control circuit 100 may include an address counter 110, a row decoder 130, a repetition address selector 150 and a repetition refresh controller 170. The address counter 110 may generate a counting address CNT<1:n> composed of a plurality of bits. The counting address CNT<1:n> may sequentially vary in response to the activation of the refresh trigger signal PRFH. For example, the counting address CNT<1:n> may increase one or more bits each time the refresh trigger signal PRFH is activated and/or deactivated. Further, the counting address may include a first portion corresponding to one or more rows of a memory bank MBANK and a second portion having at least one bit used to select one or more of the at least two memory blocks of a memory bank MBANK.

According to an example embodiment of the present invention, a row decoder 130 may control which row and/or memory cells are refreshed based on one or more of a counting address CNT<1:n>, a refresh repetition signal RRCS and a repetition enable signal DRFEN. A row decoder 130 may select one or more rows of the memory bank 130 corresponding to the counting address CNT<1:n>. For example, when the refresh repetition signal RRCS provided by a repetition refresh controller 170 is activated, the selected row of the memory bank MBANK may not have a connection with at least one bit of the counting address CNT<1:n>. The bit with which the selection of the memory bank MBANK has no connection may correspond to CNT<1>, for example. An example embodiment of a row decoder 130 of the present invention is described in greater detail later in the specification.

According to an example embodiment of the present invention, a repetition address selector 150 may select and generate a repetition address SAAR<1:n>. The repetition address SAAR<1:n> may correspond to an address that may specify a row on which two or more refresh operations are to be performed in a single refresh cycle interval. The repetition address SAAR<1:n> may correspond to a row having one or more degraded memory cells.

Figure 4:
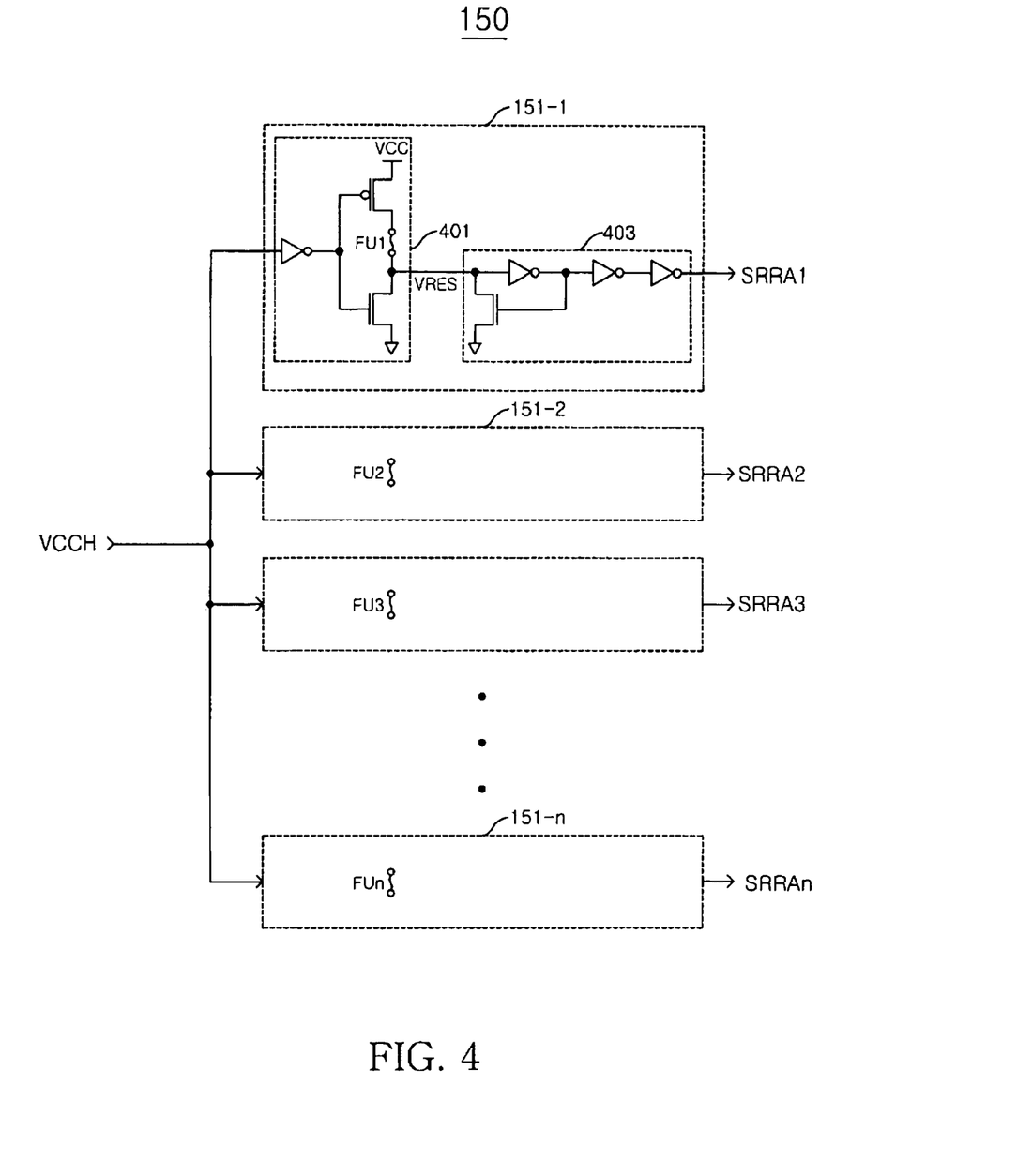
FIG. 4 is a diagram illustrating a repetition address selector according to an example embodiment of the present invention.

FIG. 4 is a diagram illustrating a repetition address selector 150 according to an example embodiment of the present invention. As illustrated in FIG. 4, a repetition address selector 150 may include a plurality of bit generation units 151-1 to 151-n having fuses FU1~FUn. A repetition address selector 150 may generate a repetition address SAAR <1:n> based on the status of one or more control fuses FU1~FUn. For example, the logic states of respective bits forming the repetition address SAAR<1:n> may be determined based on whether or not control fuses FU1~FUn have been cut. The bit generation units 151-1 to 151-n may have similar constructions and operations. Accordingly, the first bit generation unit 151-1 is representatively described to avoid unnecessary repetition within the specification.

Figure 5:
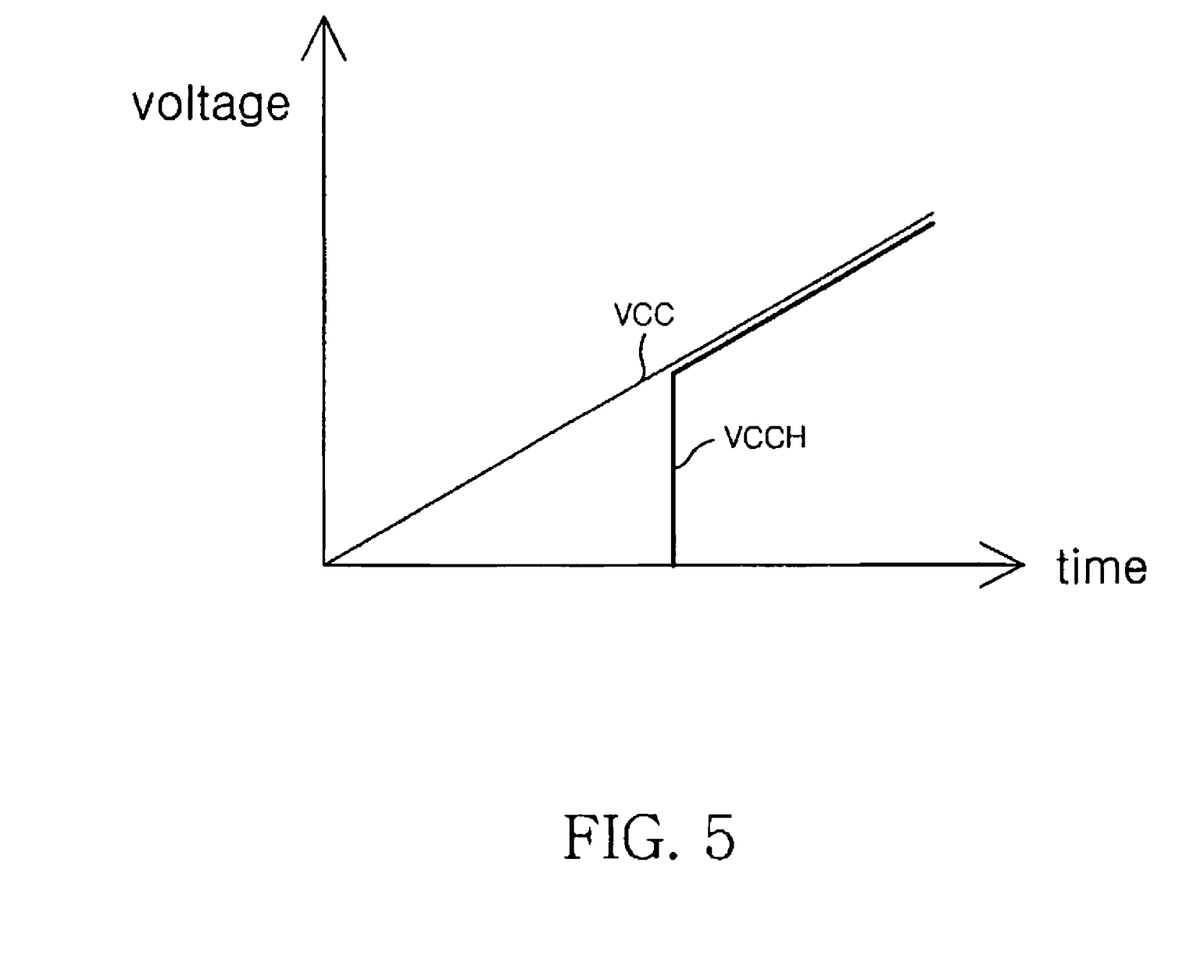
FIG. 5 is a diagram illustrating the logic state of a power-up signal at the time of power-up according to an example embodiment of the present invention.

A bit generation unit 151-1, may include a power-up response circuit 401 and latch circuit 403. The power-up response circuit 401 may generate a response signal VRES having a certain logic state in response to a power-up signal VCCH. The latch circuit 403 may reverse-latch the response signal VRES, and generate a bit SRRA1 constituting part of a repetition address. The power-up signal VCCH, as shown in FIG. 5, may be a signal that makes a transition from logic "L" to logic "H" after a period of time after power-up.

As previously described, the logic states of the bits of the response signal VRES and the repetition address may be determined depending upon whether a control fuse, for example FU1, has been cut. According to an example embodiment of the present invention, if the control fuse FU1 has been cut, the response signal VRES may be controlled to logic "L" and the address bit SRRA1 may be controlled to logic "H", at the time of power-up. If the control fuse FU1 has not been cut, the response signal VRES may be controlled to logic "H" and the address bit SRRA1 may be controlled to logic "L", at the time of power-up.

According to an example embodiment of the present invention, the cutting of control fuses FU1 to Fun included in the bit generation units 151-1 to 151-n may provide a repetition address SRRA<1:n>.

According to an example embodiment of the present invention, if none of the control fuses FU1~FUn have been cut, all bits of the repetition address SRRA1~SRRAn may be "0".

According to an example embodiment of the present invention, a circuit unit for determining whether to employ a set repetition address may be included in a refresh control circuit of an example embodiment of the present invention.

According to an example embodiment of the present invention as shown in FIG. 3, a repetition refresh controller 170 may generate a refresh repetition signal RRCS. A repetition refresh controller 170 may be configured such that when the counting address CNT<1:n> corresponds to a repetition address SRRA<1:n>, the refresh repetition signal RRCS is activated. The repetition refresh controller 170 may be enabled or disabled in response to a repetition enable signal DRFEN. For example, a repetition refresh controller 170 may be configured such that in the case where the repetition enable signal DRFEN is disabled, the refresh repetition signal RRCS is deactivated even when the counting address CNT<1:n> corresponds to the repetition address SRRA<1:n>.

According to an example embodiment of the present invention, when the semiconductor memory device includes a plurality of memory banks, the repetition enable signal DRFEN may be implemented in the form of a selection address that specifies one or more of a plurality of memory banks.

Figure 6:
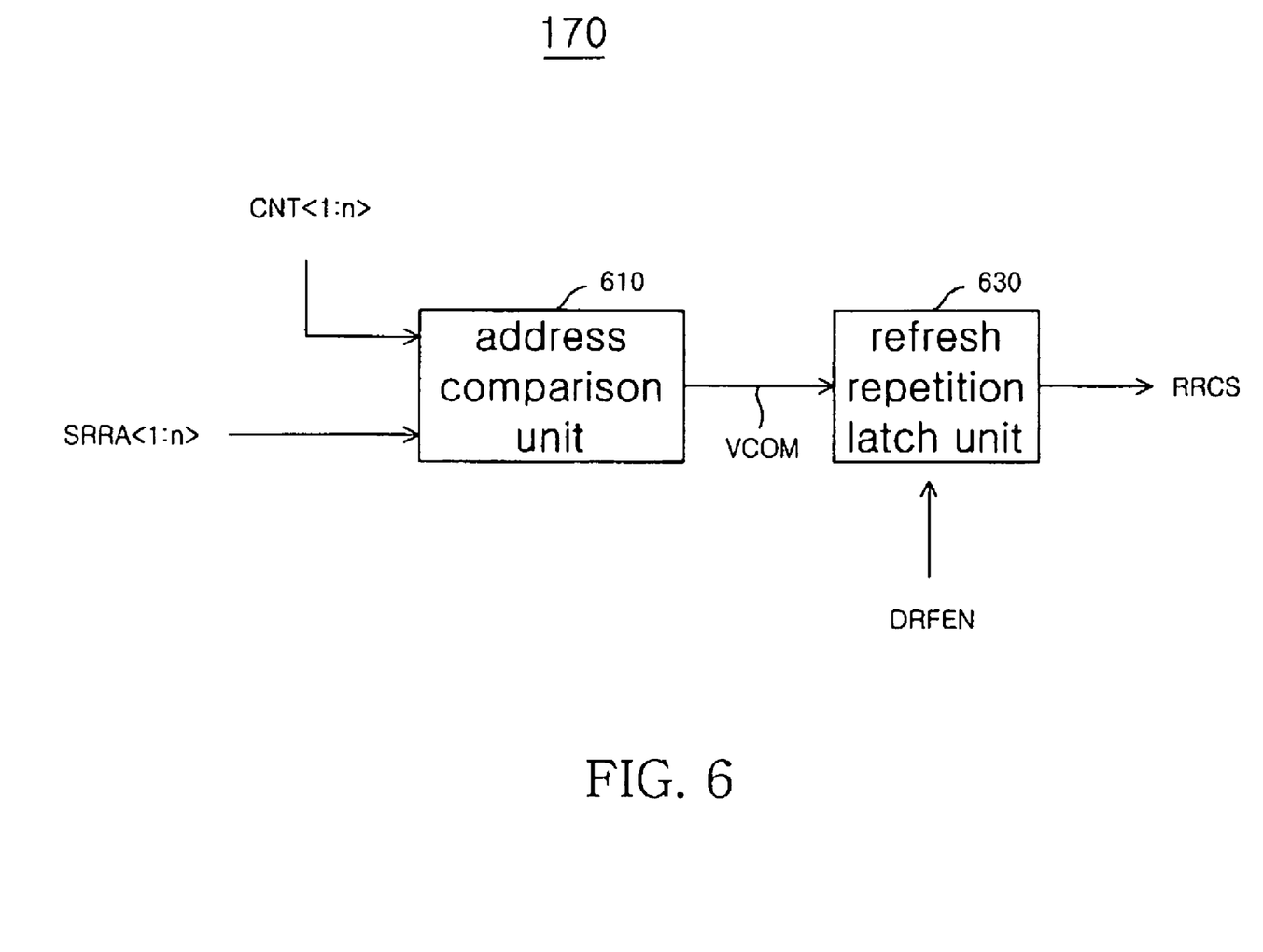
FIG. 6 is a block diagram illustrating a repetition refresh controller according to an example embodiment of the present invention.

FIG. 6 is a detailed block diagram illustrating a repetition refresh controller 170 according to an example embodiment of the present invention. As illustrated in FIG. 6, the repetition refresh controller 170 may include an address comparison unit 610 and a refresh repetition latch unit 630. The address comparison unit 610 may generate a comparison signal VCOM that may be activated in response to the activation of a counting address CNT<1:n> corresponding to repetition address SRRA<1:n>. For example, when the counting address CNT<1:n> is identical to the repetition address SRRA<1:n>, the comparison signal VCOM may be activated to "H".

According to an example embodiment of the present invention as illustrated in FIG. 6, the refresh repetition latch unit 630 may latch and generate the refresh repetition signal RRCS having a logic state corresponding to the comparison signal VCOM. The refresh repetition latch unit 630 may be controlled by the repetition enable signal DRFEN. For example, the refresh repetition latch unit 630 may enable in response to a repetition enable signal DRFEN.

Figure 7:
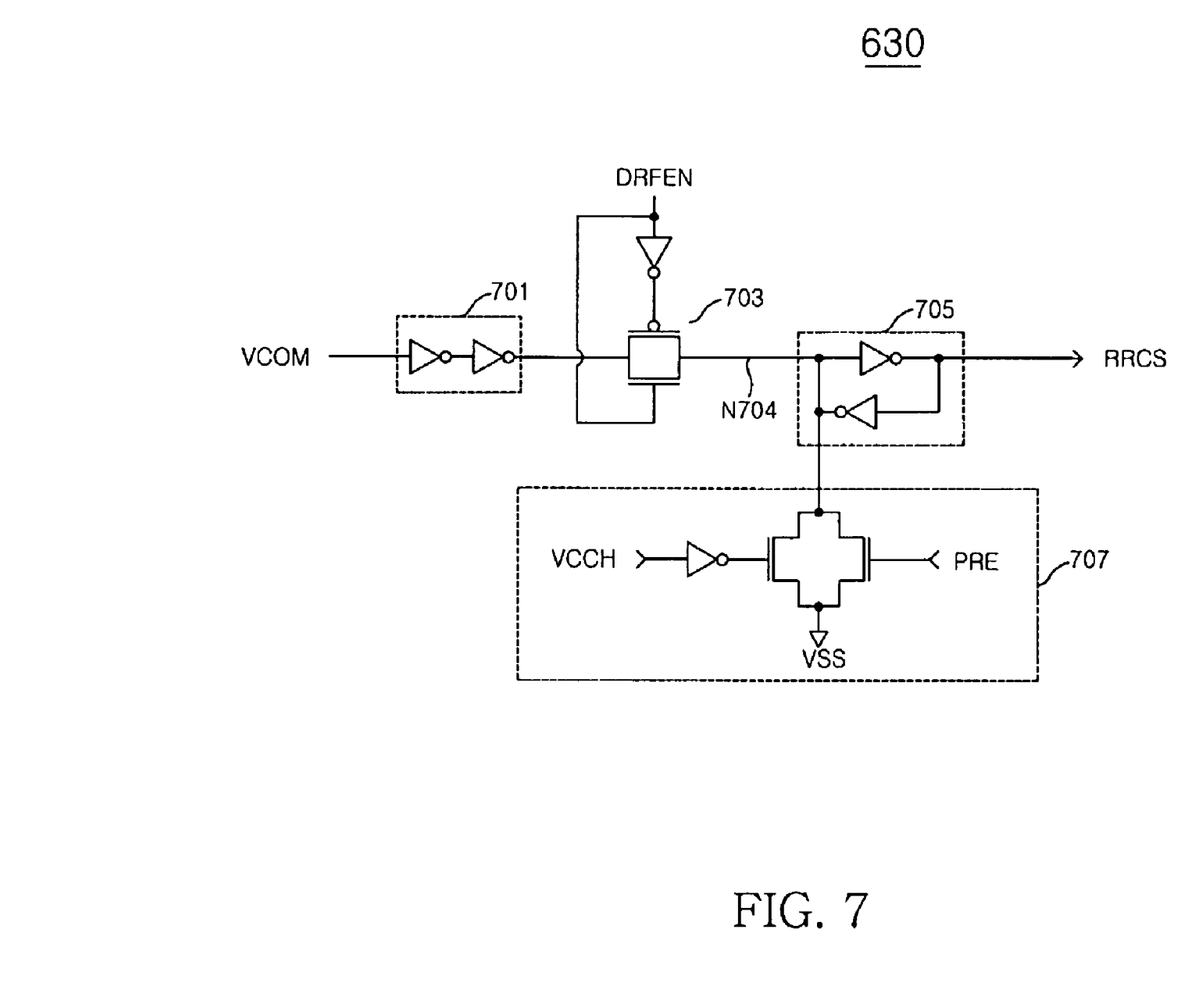
FIG. 7 is a circuit diagram illustrating a refresh repetition latch unit according to an example embodiment of the present invention.

FIG. 7 is a circuit diagram illustrating a refresh repetition latch unit 630 according to an example embodiment of the present invention. As illustrated in FIG. 7, the refresh repetition latch unit 630 may include a buffering circuit 701, a transfer gate 703, a latch circuit 705 and a reset circuit 707.

According to an example embodiment of the present invention, the buffering circuit 701 may buffer the comparison signal VCOM, and the transfer gate 703 may transfer the output signal of the buffering circuit 701 in response to the repetition enable signal DRFEN. For example, when the repetition enable signal DRFEN is "H", the transfer gate 703 may transfer the buffered comparison signal VCOM to the latch circuit 705. The reset circuit 707 may be configured to reset the input terminal N704 of the latch circuit 705. Further, the reset circuit 707 may be configured to initially set the input terminal N704 of the latch circuit 705 in response to the power-up signal VCCH.

Figure 8:
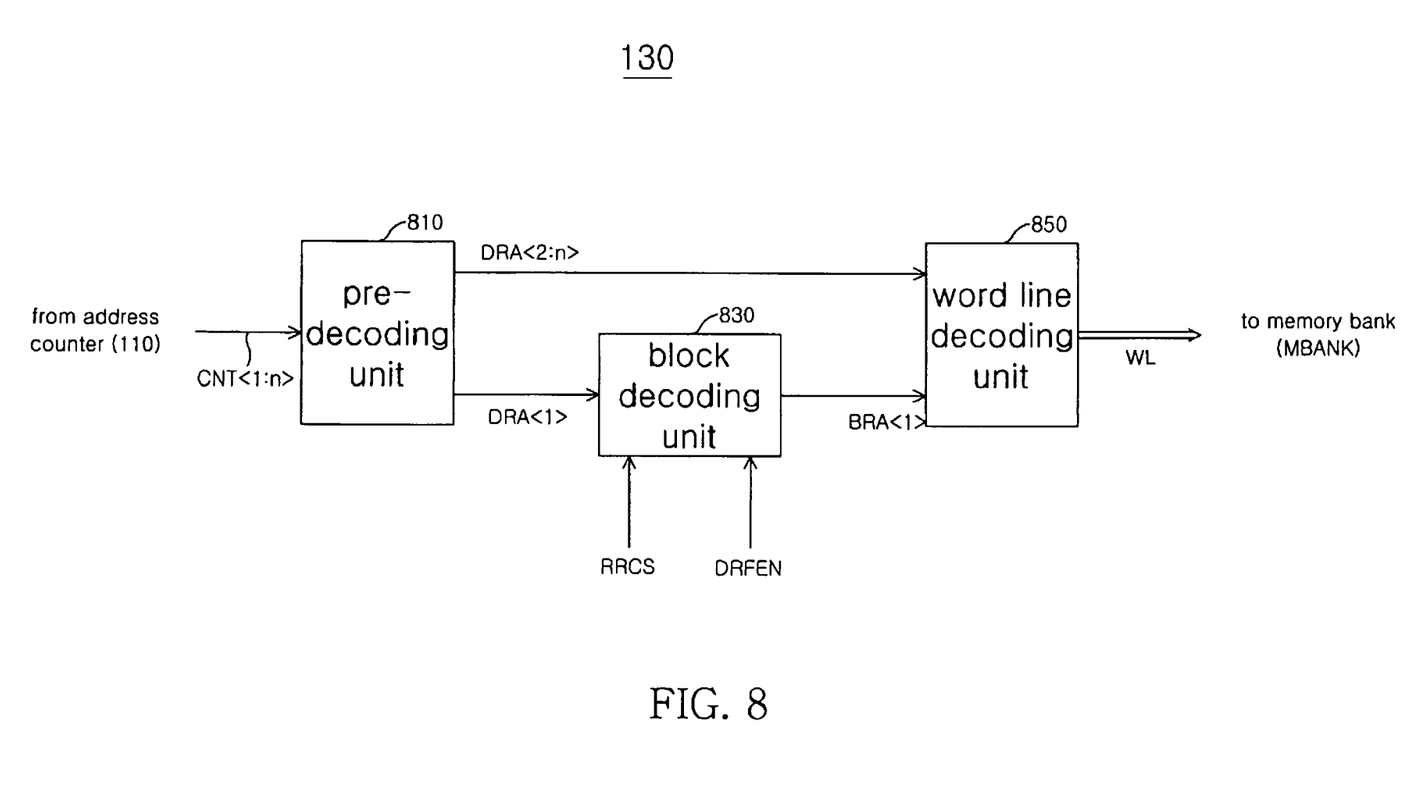
FIG. 8 is a block diagram illustrating a row decoder according to an example embodiment of the present invention.

FIG. 8 is a block diagram illustrating a row decoder 130 according to an example embodiment of the present invention. As illustrated in FIG. 8, the row decoder 130 may include a pre-decoding unit 810, a block decoding unit 830 and a word line decoding unit 850.

The pre-decoding unit 810 may pre-decode the counting address CNT<1:n> and generate a pre-decoding signal DRA<1:n>. According to an example embodiment of the present invention as illustrated in FIG. 8, the pre-decoding unit may provide a pre-decoding signal DRA<1:n> that includes a pre-decoding address DRA<1> corresponding to a second portion of the counting address and a pre-decoding address DRA <2:n> corresponding to a first portion of the counting address.

The block decoding unit 830 may decode a second portion of a counting address corresponding to a bit that selects any one of the memory blocks included in the memory bank MBANK (see FIG. 3).

Figure 9:
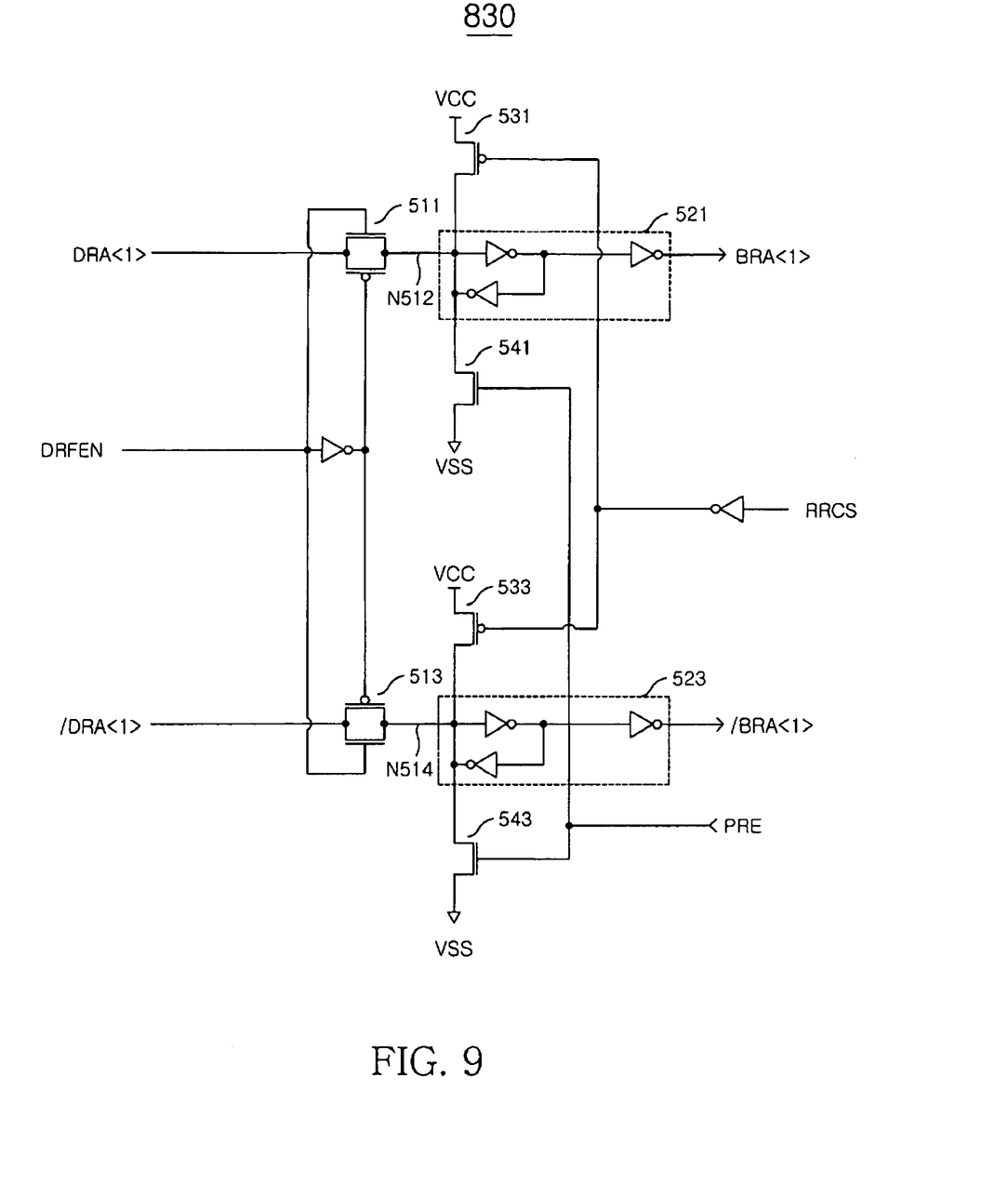
FIG. 9 is a circuit diagram illustrating a block decoding unit according to an example embodiment of the present invention.

FIG. 9 is a circuit diagram illustrating a block decoding unit 830 according to an example embodiment of the present invention. As illustrated in FIG. 9, the block decoding unit 830 may include a transfer transistor pair 511 and 513, a latch circuit pair 521 and 523, and a reset transistor pair 531 and 533.

The transfer transistor pair 511 and 513 may transmit a pre-decoding address pair DRA<1> and /DRA<1> corresponding to the second portion of the counting address (e.g., a bit that selects a memory block) in response to the repetition enable signal DRFEN. The latch circuit pair 521 and 523 may be configured to latch a pre-decoding address pair DRA<1> and /DRA<1> transmitted by the transfer transistor pair 511 and 513.

Furthermore, the reset transistor pair 531 and 533 may be configured to reset the input terminals N512 and N514 of the latch circuit pair 521 and 523 to logic "H" in response to a refresh repetition signal RRCS. The reset transistor pair 531 and 533 may be a pair of PMOS transistors. For example, in the case where the refresh repetition signal RRCS has been activated to "H", the reset transistor pair 531 and 533 is turned on and the input terminals N512 and N514 of the latch circuit pair 521 and 523 may be controlled to logic "H". According to an example embodiment of the present invention, in this case, all of the block decoding addresses BRA<1> and /BRA<1> may become logic "H".

According to an example embodiment of the present invention as illustrated in FIG. 9, a NMOS transistor pair 541 and 543 may reset the input terminals N512 and N514 of the latch circuit pair 521 and 523 to logic "L" at the time of pre-charge.

Accordingly, in an example embodiment of the present invention, the block decoding unit 830 may selectively activate any one of the block decoding address pair BRA<1> and /BRA<1> in response to a pre-decoding address DRA<1> during normal operation, e.g., when the refresh repetition signal RRCS is "L". However, when the refresh repetition signal RRCS is "H", each of the block decoding address pair BRA<1> and /BRA<1> may be controlled to "H" regardless of the second portion of the counting address (e.g., a bit that selects any one of the memory blocks).

Referring to an example embodiment of the present invention as shown in FIG. 8 again, the word line decoding unit 850 may decode a block decoding address BRA<1> provided by the block decoding unit 830 and a pre-decoding address DRA<2:n> corresponding to a first portion of the counting address provided by the pre-decoding unit 810, and may drive the word line of the memory bank MBANK.

According to an example embodiment of the present invention, if the refresh repetition signal RRCS is activated because the counting address CNT<1:n> corresponds to the repetition address SAAR<1:n>, the word line decoding unit 850 may activate the word lines of a row actually corresponding to the remaining pre-decoding addresses DRA<2:n> corresponding to the first portion of the counting address. Accordingly, when the refresh repetition signal RRCS is activated, two rows may be selected from a single memory bank MBANK.

Figure 10:
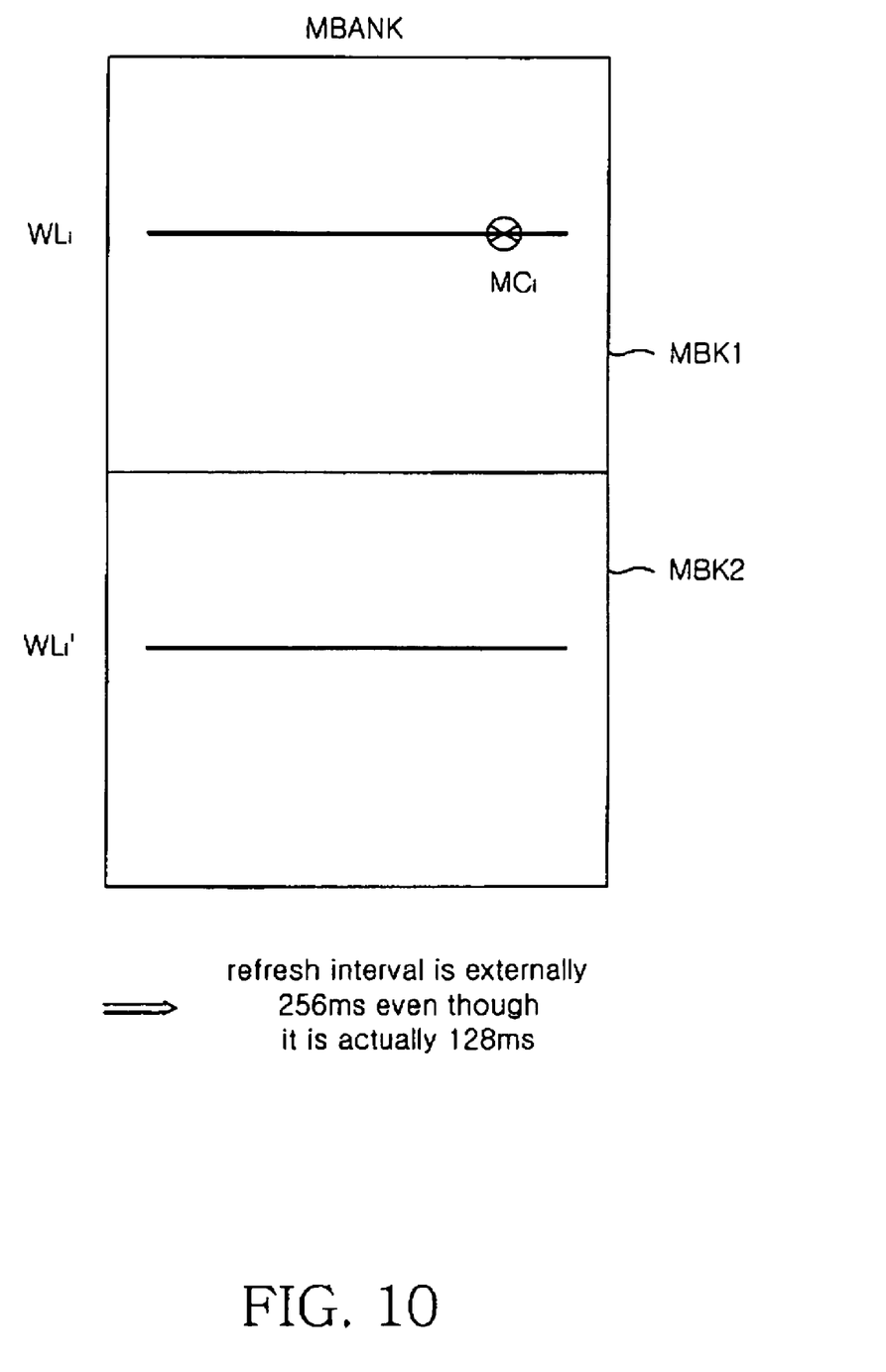
FIG. 10 is a diagram illustrating the refresh interval of a degraded memory cell of the semiconductor memory device according to an example embodiment of the present invention.

According to an example embodiment of a refresh control circuit of the present invention and the semiconductor memory device having the same, when a degraded memory cell MCi is present in a single memory bank (e.g., MBANK as shown in FIG. 10), an address that selects a row corresponding to the word line WL of the degraded memory cell MCi may be selected as the repetition refresh address SRRA<1:n>. In this case, the word line WL of the degraded memory cell of the first memory block MBK1 is activated when a counting address corresponding to a word line WLi'CNT<1:n> is generated in the second memory block MBK2 as well as the case where a counting address CNT<1: n> corresponding to the word line WLi itself is generated. Accordingly, the degraded memory cell MCi performs two actual refresh operations in a single refresh cycle interval. Therefore, according to an example embodiment of the present invention, even though a refresh operation may be externally performed at intervals of 256 ms, the degraded memory cell MCi performs a refresh operation at intervals of 128 ms. Intervals of 256 ms and 128 ms are merely illustrative and not meant to limit the present invention.

Figure 11:
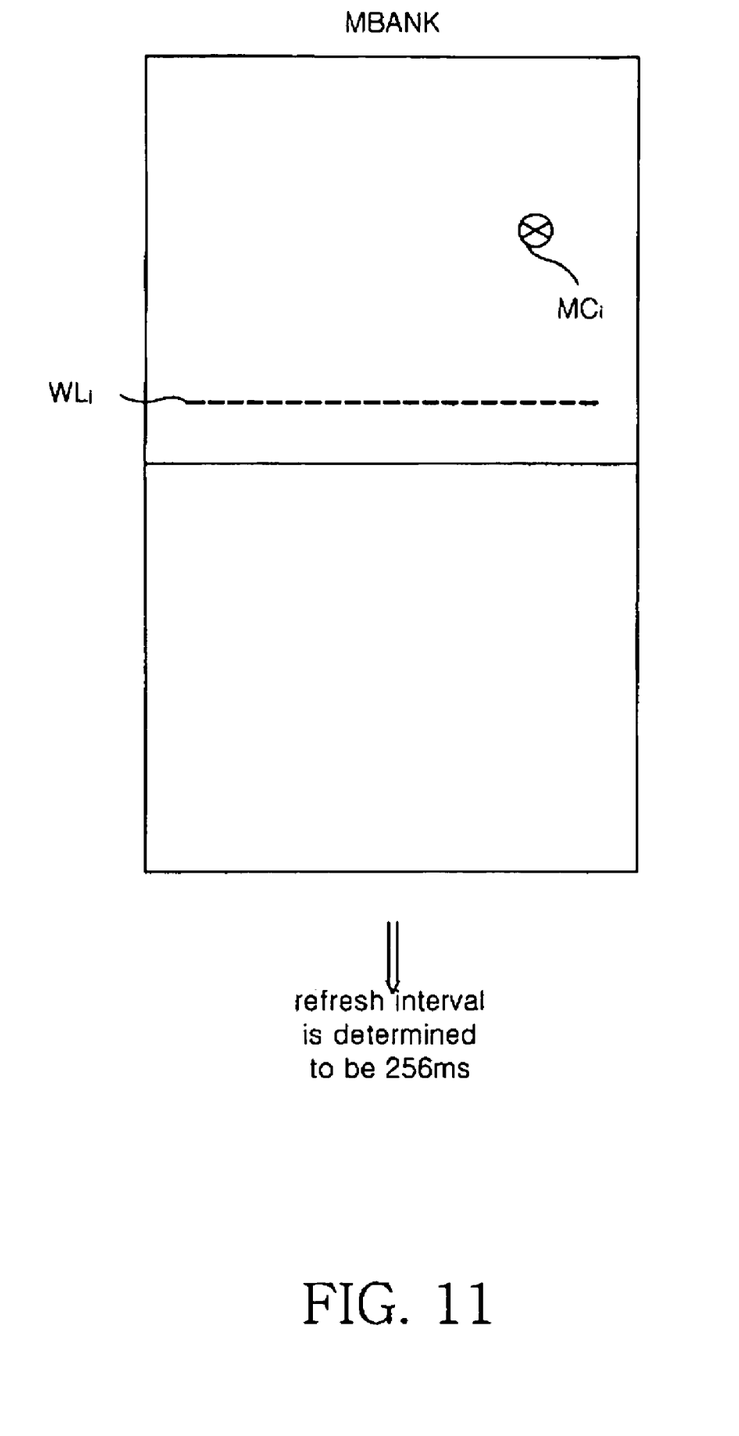
FIG. 11 is a diagram illustrating the refresh interval of non-degraded memory cells of a semiconductor memory device according to an example embodiment of the present invention.

Further, according to an example embodiment of the present invention as illustrated in FIG. 11, for a word line WLj that does not correspond to a degraded memory cell MCi, a refresh operation may be performed only in association with the counting address CNT<1:n> that corresponds to the word line WLj itself. That is, memory cells other than the degraded memory cell MCi perform refresh operations at intervals of 256 ms, for example.

Figure 12:
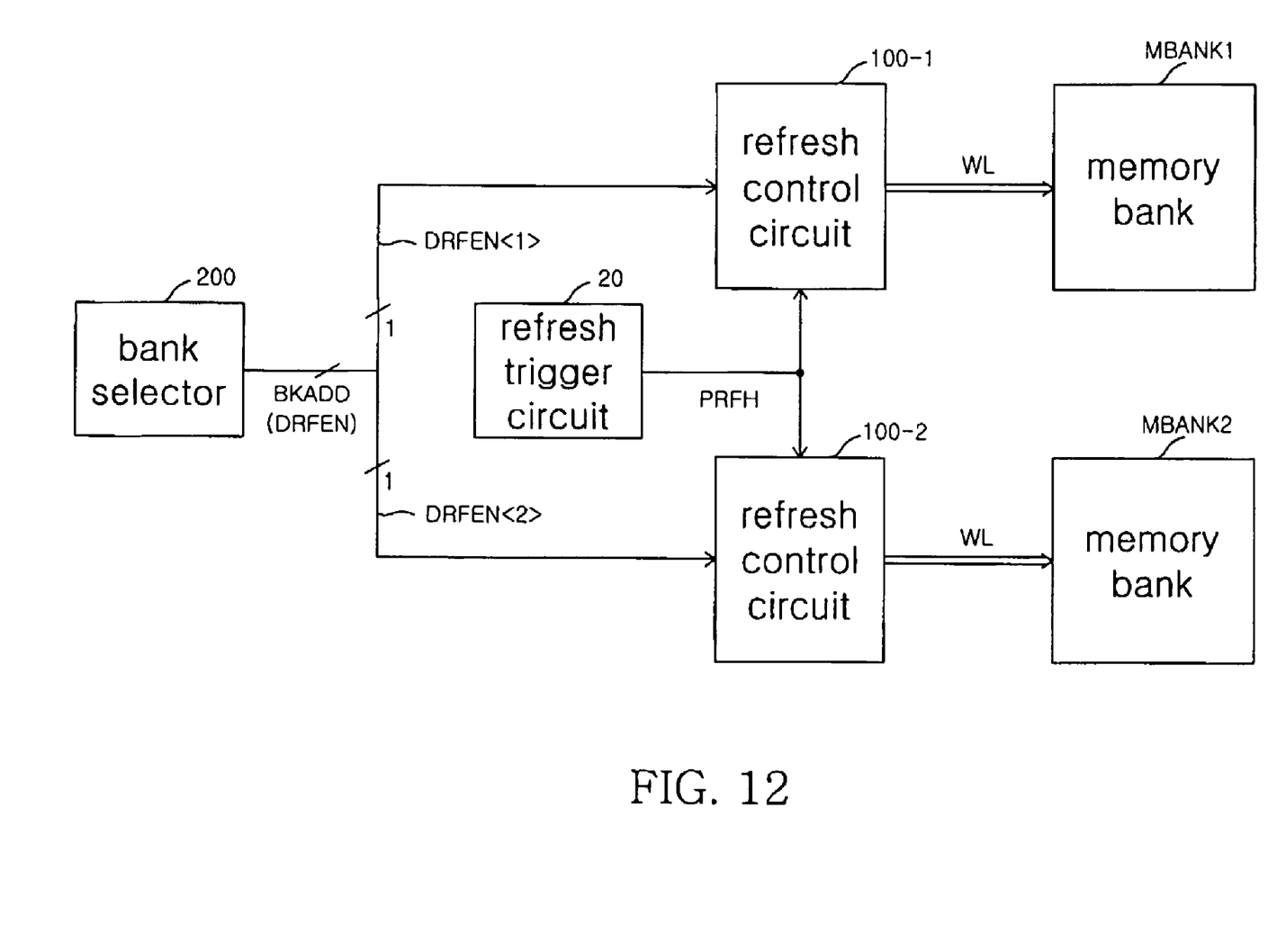
FIG. 12 is a diagram schematically illustrating a semiconductor memory device according to an embodiment of the present invention.

Further, according to an example embodiment of the present invention as shown in FIG. 12, the teachings of example embodiments of the present invention, as previously described, can be applied to a semiconductor memory device having two or more memory banks.

As illustrated in FIG. 12, a semiconductor memory device according to an example embodiment of the present invention may include memory banks MBANK1 and MBANK2, a refresh trigger circuit 20, refresh control circuits 100-1 and 100-2 and a bank selector 200. Since the memory banks MBANK1 and MBANK2, the refresh trigger circuit 20 and the refresh control circuits 100-1 and 100-2 are similar to the memory banks MBANK, refresh trigger circuit 20 and refresh control circuits 100 of FIG. 3, detailed descriptions thereof are omitted.

According to an example embodiment of the present invention, a bank selector 200 may generate bank selection addresses BKADD that specify the memory banks MBANK1 and MBANK2. The bank selector 200 may have almost the same construction and operation as each of the bit generation units 151-1 to 151-n of FIG. 4. Accordingly, a detailed description of the bank selector 200 is also omitted.

In the example embodiment of the present invention illustrated in FIG. 12, the repetition enable signal DRFEN of a refresh control circuit 100-1 or 100-2 corresponding to each memory bank MBANK1 or MBANK2 may be the bank selection address BKADD. For example, if the bank selection address BKADD has a logic value of "L", the repetition enable signal DRFEN<1> of the refresh control circuit 100-1 may be activated. Further, for example, if the bank selection address BKADD has a logic value of "H", the repetition enable signal DRFEN<2> of the refresh control circuit 100-2 may be activated.

Although the present invention has been described with reference to the example embodiments of the present invention shown in the drawings, the example embodiments are only illustrative and those skilled in the art will understand that various modifications and other equivalent embodiments are possible therefrom.

For example, in the present specification, an example embodiment of the present invention in which a single memory bank is composed of two memory blocks that use separate bit lines has been illustrated and described. However, a single memory bank may be composed of four or more memory blocks, and thus, a degraded memory cell may undergo four or more refresh operations in a single refresh cycle interval.

According to example embodiments of a refresh control circuit of the present invention and a semiconductor memory device having the same, a degraded memory cell may perform two or more refresh operations in a period, (e.g., a single refresh cycle interval), in which non-degraded memory cells each perform a single refresh operation. Accordingly, using example embodiments of a refresh control circuit of the present invention and the semiconductor memory device having the same, a long refresh interval may be set for non-degraded memory cells as a whole, whereas a short refresh interval may be set for a degraded memory cell. As a result, the refresh intervals of the semiconductor memory device having an example embodiment of a refresh control circuit of the present invention can be efficiently set, thereby significantly minimizing unnecessary power consumption.

What is claimed is:

1. A refresh control circuit for a semiconductor memory device, comprising:
    an address counter configured to generate a counting address composed of a plurality of bits;
    a repetition address selector configured to generate a repetition address;
    a repetition refresh controller configured to generate a refresh repetition signal based on the counting address and the repetition address; and
    a row decoder configured to select a row of a memory bank based on the counting address and the refresh repetition signal.

2. The refresh control circuit as set forth in claim 1, wherein the row decoder selects the row of the memory bank regardless of at least one bit of the counting address.

3. The refresh control circuit as set forth in claim 1, wherein the row decoder selects the row based on a first portion of the counting address and ignores a second portion of the counting address having at least one bit.

4. The refresh control circuit as set forth in claim 1, wherein the repetition address selector comprises a plurality of bit generation units each having at least one control fuse, each of the plurality of bit generation units determining an address bit of the repetition address based on the status of the at least one control fuse.

5. The refresh control circuit as set forth in claim 4, wherein the bit generation units each comprise:
    power responder configured to generate a response signal having a certain logic state in response to a power-up signal, the logic state of the response signal being controlled depending upon whether the at least one control fuse has been cut; and
    a refresh control latch configured to latch the response signal.

6. The refresh control circuit as set forth in claim 1, wherein the repetition refresh controller comprises:
    an address comparison unit configured to generate a comparison signal based on a comparison of the counting address and the repetition address; and
    a refresh repetition latch unit configured to latch and generate the refresh repetition signal having a logic state corresponding to the comparison signal.

7. The refresh control circuit as set forth in claim 6, wherein the refresh repetition latch unit comprises:
    a transfer gate configured to transfer a signal based on the comparison signal and a repetition enable signal; and
    a latch configured to latch the signal transferred through the transfer gate.

8. The refresh control circuit as set forth in claim 7, wherein the refresh repetition latch unit further comprises reset configured to reset the latch.

9. The refresh control circuit as set forth in claim 3, wherein:
    the memory bank comprises at least two memory blocks;
    the row decoder comprises,
    a block decoding unit configured to decode the counting address based on the second portion of the counting address corresponding to a bit that selects at least one of the memory blocks, and selectively activate at least one pair of block decoding addresses in response to activation of the refresh repetition signal, and
    a word line decoding unit configured to decode addresses based on a first portion of the counting address and the at least one pair of block decoding addresses, and driving a word line of the memory bank.

10. The refresh control circuit as set forth in claim 9, wherein the at least one pair of block decoding addresses are activated in response to activation of the refresh repetition signal.

11. The refresh control circuit as set forth in claim 10, wherein the block decoding unit comprises:
    a transfer transistor pair configured to transfer an address pair corresponding to the second portion of the counting address, in response to a repetition enable signal;
    a latch pair configured to latch the address pair transferred by the transfer transistor pair; and
    a reset transistor pair configured to reset the latch pair based on the refresh repetition signal.

12. A semiconductor memory device, comprising:
    a memory bank comprising a plurality of memory cells arranged in a matrix composed of rows and columns;

a refresh trigger circuit configured to generate a refresh trigger signal that is activated at refresh intervals; and a refresh control circuit according to claim 1 activated in response to the refresh trigger signal.

13. A semiconductor memory device, comprising:

a plurality of memory banks each comprising a plurality of memory cells arranged in a matrix composed of rows and columns;

a refresh trigger circuit configured to generate a refresh trigger signal that is activated at refresh intervals;

a plurality of refresh control circuits according to claim 1, each configured to enable in response to a corresponding repetition enable signal and control refresh of a corresponding memory bank; and a bank selector configured to generate a bank selection address specifying the memory bank;

wherein the repetition enable signal is enabled in response to the bank selection address.

14. A semiconductor memory device, comprising:

a memory bank comprising a plurality of memory cells arranged in a matrix composed of rows and columns;

a refresh trigger circuit configured to generate a refresh trigger signal that is activated at refresh intervals; and a refresh control circuit configured to sequentially select rows of the memory bank in response to the refresh trigger signal and select a row corresponding to a repetition address at least two times during a single refresh cycle interval.

15. The semiconductor memory device as set forth in claim 14, wherein the refresh control circuit comprises:

an address counter configured to generate a counting address composed of a plurality of bits;

a repetition address selector configured to generate a repetition address;

a repetition refresh controller configured to generate a refresh repetition signal based on the counting address and the repetition address; and a row decoder configured to select a row of the memory bank based on the counting address and the refresh repetition signal.

16. A semiconductor memory device, comprising:

a plurality of memory banks each comprising a plurality of memory cells arranged in a matrix composed of rows and columns;

a refresh trigger circuit configured to generate a refresh trigger signal that is activated at refresh intervals;

a plurality of refresh control circuits each configured to enable in response to a corresponding repetition enable signal and control refresh of a corresponding memory bank, the refresh control circuit sequentially selecting rows of the memory bank in response to the refresh trigger signal and operating to select a row corresponding to a repetition address at least two times during a single refresh cycle interval; and a bank selector configured to generate a bank selection address specifying the memory bank;

wherein the repetition enable signal is enabled in response to the bank selection address.

17. The semiconductor memory device as set forth in claim 16, wherein the refresh control circuits each comprises:

an address counter configured to generate a counting address composed of a plurality of bits;

a repetition address selector configured to generate a repetition address;

a repetition refresh controller configured to generate a refresh repetition signal based on the counting address and the repetition address; and a row decoder configured to select a row of a memory bank based on the counting address and the refresh repetition signal.

18. A method of performing a repetition refresh operation on a semiconductor device including at least one memory bank having at least two memory blocks, the method comprising:

receiving a refresh trigger signal having a first portion and second portion, the second portion having at least one bit corresponding to any one of the at least two memory blocks; generating a counting address having a first portion and second portion in response to the refresh trigger signal, the second portion having at least one bit corresponding to any one of the at least two memory blocks;

generating a repetition address corresponding to a row having at least one degraded memory cell;

providing a refresh repetition signal based on a comparison of the counting address and repetition address;

selecting a row to be refreshed based on at least one of the counting address, repetition address, and the refresh repetition signal.

19. The method of performing a repetition refresh operation according to claim 18, wherein the selecting comprises:

pre-decoding the counting address into a pre-decoding signal having a first pre-decoding address corresponding to the first portion of the counting address and a second pre-decoding address corresponding to the second portion of the counting address;

generating a block decoding pair based on the second pre-decoding address;

activating at least one of the block decoding pair based on a repetition refresh signal; and selecting a word line based on a result of the activating and the first pre-decoding address.

20. A row decoder comprising:

a pre-decoding unit configured to pre-decode a counting address into a first pre-decoding address and a second pre-decoding address corresponding to any one of the memory blocks including in the at least one memory bank;

a block decoding unit configured to decode the second pre-decoding address and selectively activate at least one pair of block decoding addresses based on a refresh repetition signal; and a word line decoding unit configured to drive at least one word line based on the at least one pair of block decoding addresses and the first pre-decoding address.

21. A refresh control circuit for a semiconductor memory device, comprising:

an address counter configured to generate a counting address composed of a plurality of bits;

a repetition address selector configured to generate a repetition address;

a repetition refresh controller configured to generate a refresh repetition signal based on the counting address and the repetition address; and a row decoder according to claim 20 configured to select a row of a memory bank based on the counting address and the refresh repetition signal.

22. A semiconductor memory device, comprising:

a memory bank comprising a plurality of memory cells arranged in a matrix composed of rows and columns;

a refresh trigger circuit configured to generate a refresh trigger signal that is activated at refresh intervals; and a refresh control circuit configured to sequentially select rows of the memory bank in response to the refresh trigger signal, wherein the refresh control circuit includes an address counter configured to generate a counting address composed of a plurality of bits in response to the refresh trigger signal, a repetition address selector configured to generate a repetition address, a repetition refresh controller configured to generate a refresh repetition signal based on the counting address and the repetition address; and a row decoder according to claim 20 configured to select a row corresponding to a repetition address at least two times during a single refresh cycle interval based on the counting address and the refresh repetition signal.

23. A semiconductor memory device, comprising:

a plurality of memory banks each comprising a plurality of memory cells arranged in a matrix composed of rows and columns;

a refresh trigger circuit configured to generate a refresh trigger signal that is activated at refresh intervals;

a plurality of refresh control circuits each configured to enable in response to a corresponding repetition enable signal and control refresh of a corresponding memory bank; and a bank selector configured to generate a bank selection address specifying the memory bank;

wherein the repetition enable signal is enabled in response to the bank selection address and each of the refresh control circuit includes an address counter configured to generate a counting address in response to the refresh trigger signal, a repetition address selector configured to generate a repetition address, a repetition refresh controller configured to generate a refresh repetition signal based on the counting address and the repetition address; and a row decoder according to claim 20 configured to select a row corresponding to the repetition address at least two times during a single refresh cycle interval based on the counting address and the refresh repetition signal.

* * * * *